United States Patent
Thorp et al.

(10) Patent No.: US 6,515,527 B2
(45) Date of Patent: Feb. 4, 2003

(54) METHOD FOR SMOOTHING DI/DT NOISE DUE TO CLOCK TRANSITIONS

(75) Inventors: Tyler J. Thorp, Sunnyvale, CA (US); Brian W. Amick, Sunnyvale, CA (US); Dean liu, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/887,395

(22) Filed: Jun. 22, 2001

(65) Prior Publication Data

US 2002/0196075 A1 Dec. 26, 2002

(51) Int. Cl.$^7$ ................................................ H03K 5/12
(52) U.S. Cl. ........................ 327/170; 327/165; 327/299
(58) Field of Search ............................... 327/165, 170, 327/299, 233

(56) References Cited

U.S. PATENT DOCUMENTS 6,069,510 A * 5/2000 Keeth ........................... 327/161
6,320,438 B1 * 11/2001 Arcus ........................... 327/165

* cited by examiner

Primary Examiner—Terry D. Cunningham
(74) Attorney, Agent, or Firm—Rosenthal & Osha L.L.P.

(57) ABSTRACT

A method for increasing a transition time period for an edge transition of a clock signal has been developed. The method includes detecting an edge transition of a clock signal of a computer system. Next, additional system power consumption is initiated upon detection of the edge transition. This additional power consumption will lengthen the edge transition time period of the clock signal.

13 Claims, 2 Drawing Sheets

METHOD FOR SMOOTHING DI/DT NOISE DUE TO CLOCK TRANSITIONS

BACKGROUND OF INVENTION

1. Field of the Invention

The invention relates generally to microelectronic circuitry. More specifically, the invention relates to a method of reducing noise due to current demand during clock transitions.

2. Background Art

In all microprocessor-based systems, including computers, the clock circuit is a critical component. The clock circuit generates a clock signal that is a steady stream of timing pulses that synchronize and control the timing of every operation of the system. FIG. 1 shows a prior art diagram of an ideal clock signal 10. An entire clock cycle 12 includes a rising or leading edge 14 and a falling or trailing edge 16. These edges 14, 16 define the transition between the low and high value of the signal.

Clock noise problems on the system power grid are usually caused by the large amount of current that is used in clock signal distribution. This current comes from the switching transistors that control the clock signal. As these transistors switch states, the current noise spikes onto the power grid due to the current demand or "current draw" of the switching transistors. These high current demands cause noise in the system voltage supply due to voltage (IR) drops and inherent system inductance (L di/dt). A clock signal distribution circuit uses a significant amount of current in a short amount of time because the spikes occur twice per clock cycle: once on the current draw of the leading edge and once on the current draw of the falling edge of the signal. This puts the noise at a very high frequency (2× the clock frequency). This noise can cause missed timing if the clock signal voltage is too low or component failure if the clock signal voltage is too high. The noise can even escape "off the chip" and affect the other components of the system.

FIG. 2 shows a prior art diagram of a clock distribution tree 20. The initial clock signal (CLK4) is input into a series of load buffers 22, 24, and 26. Finally, the clock signal (CLK1) is input into a large load buffer 28 which outputs the final clock signal (CLK0). Each of these buffers 22, 24, 26, and 28 represents certain system components that place a load on the clock signal. The last buffer 28 represents the largest load of the system. Also, each buffer 22, 24, 26, and 28 places a slight delay on the transmission of the clock to the next buffer. Consequently, the signal for each segment of the clock tree 20 CLK4, CLK3, CLK2, CLK1, and CLK0 lags slightly behind the signal of the immediately preceding segment. In this embodiment of a clock tree 20, the greatest current demand will come from the large load buffer 28 and it will consequently generate the greatest amount of noise.

FIG. 3 shows a prior art graph of a clock signal 30. The signal is plotted as power (which is a function of current) versus time. As shown, the clock signal begins at the "LOW" value 32 and rapidly transitions 34 to the "HIGH" value 36. After remaining at the "HIGH" value 36 for a specified period of time, the clock signal rapidly transitions 35 back to the "LOW" value 32. Both transitions 34 and 35 take place in a very short period of time or "Δt" 38. However, the circuit cannot effectively respond to the current demands in this short of a Δt. The demand is so great that the result is a significant amount of noise on the system, especially if the clock signal is serving a large load.

A common technique to alleviate noise is adding additional power to the grid. This power is added upon sensing a voltage drop due to noise. However, such techniques only respond to noise at a much lower frequency than clock noise and also respond only to a certain threshold of noise. Consequently, a need exists for a technique that generates a response to clock noise at a synchronized current draw.

SUMMARY OF INVENTION

In some aspects, the invention relates to a method for increasing a transition time period for an edge transition of a clock signal, comprising: detecting an edge transition of a clock signal; and initiating an additional system power consumption upon detecting the edge transition.

In another aspect, the invention relates to a method for increasing a transition time period for an edge transition of a clock signal, comprising: step of detecting an edge transition of a clock signal; and step of initiating an additional system power consumption upon detecting the edge transition.

In another aspect, the invention relates to an apparatus for increasing a transition time period for an edge transition of a clock signal, comprising: a control circuit that detects an edge transition of a clock signal; and a power consumption circuit that uses system power upon detection of the edge transition by the control circuit.

In another aspect, the invention relates to an apparatus for increasing a transition time period for an edge transition of a clock signal, comprising: means for detecting an edge transition of a clock signal; and means for using system power upon detection of the edge transition.

Other aspects and advantages of the invention will be apparent from the following description and the appended claims.

DETAILED DESCRIPTION

Figure 3:
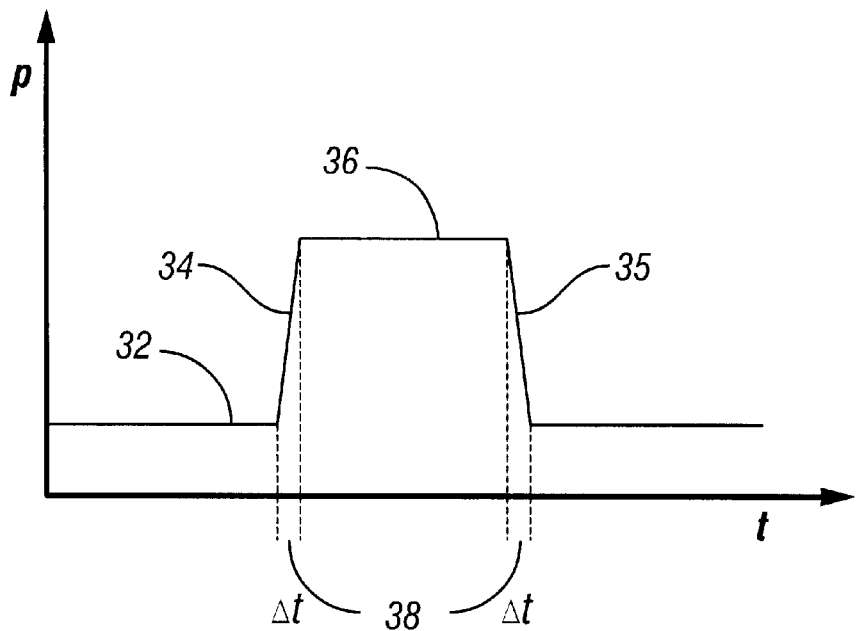
FIG. 3 shows a prior art graph of a clock signal.
Figure 4:
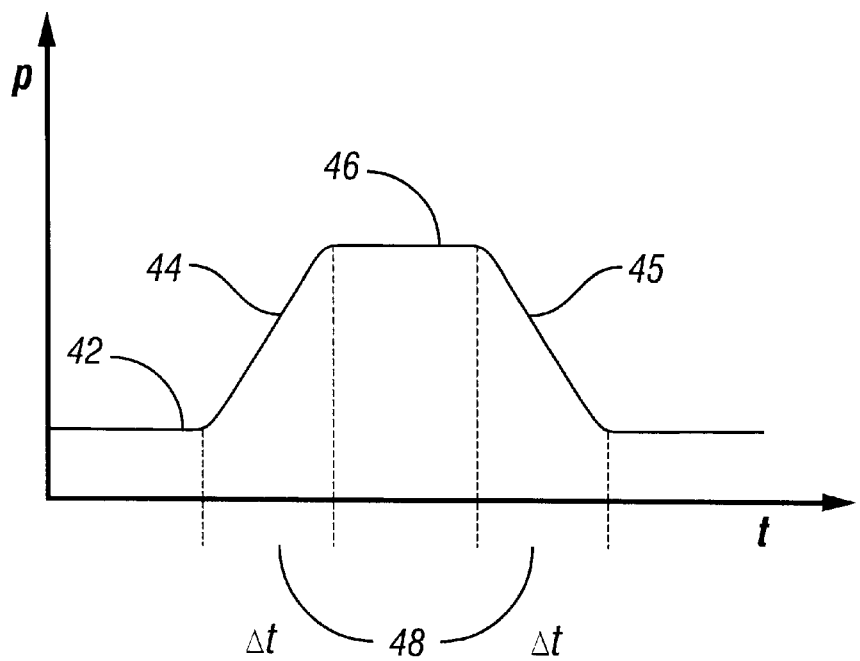
FIG. 4 a shows a graph of a clock signal in accordance with one embodiment of the present invention.

The present invention involves a method to reduce noise due to clock signal transition by decreasing the rate of the clock current spike (di/dt). The di/dt is reduced by using a synchronized current draw that widens the period of the current demand. FIG. 4 shows a graph of a clock signal 40 in accordance with one embodiment of the present invention. The signal is plotted as power (which is a function of current) versus time. As shown, the clock signal begins at the "LOW" value 42 and slowly transitions 44 to the "HIGH" value 46. After remaining at the "HIGH" value 46 for a specified period of time, the clock signal slowly transitions 45 back to the "LOW" value 42. As compared with the prior art signal shown in FIG. 3, both signal transitions 44 and 45 take place within a much longer period of time or "Δt" 48. In the embodiment shown in FIG. 4, the Δt is approximately 10× longer than the prior art Δt shown in FIG. 3.

The Δt 48 is expanded by taking an earlier arriving clock signal from a circuit load and burning power in a "warm-up" period. This burning of power slows the transition of the power rates of the clock signal and allows the circuit enough time to respond to the current draw. The widened spike will suffer from less from inherent system inductance (L di/dt) and consequently generate less noise and produce better edge transitions.

Figure 1:
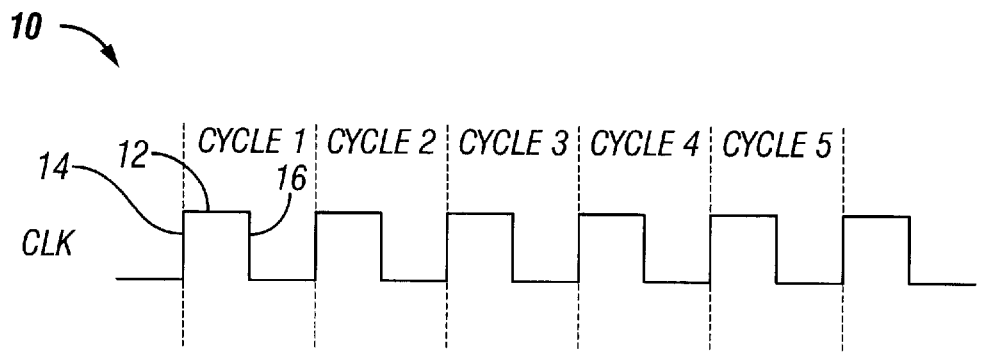
FIG. 1 shows a prior art diagram of an ideal clock signal.
Figure 2:
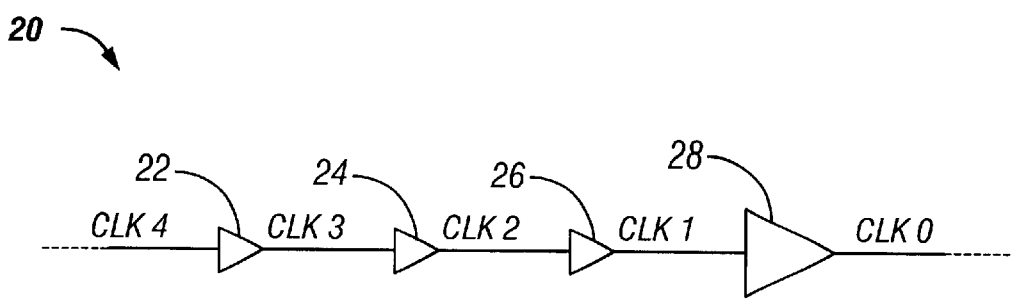
FIG. 2 shows a prior diagram of a clock distribution tree.
Figure 5:
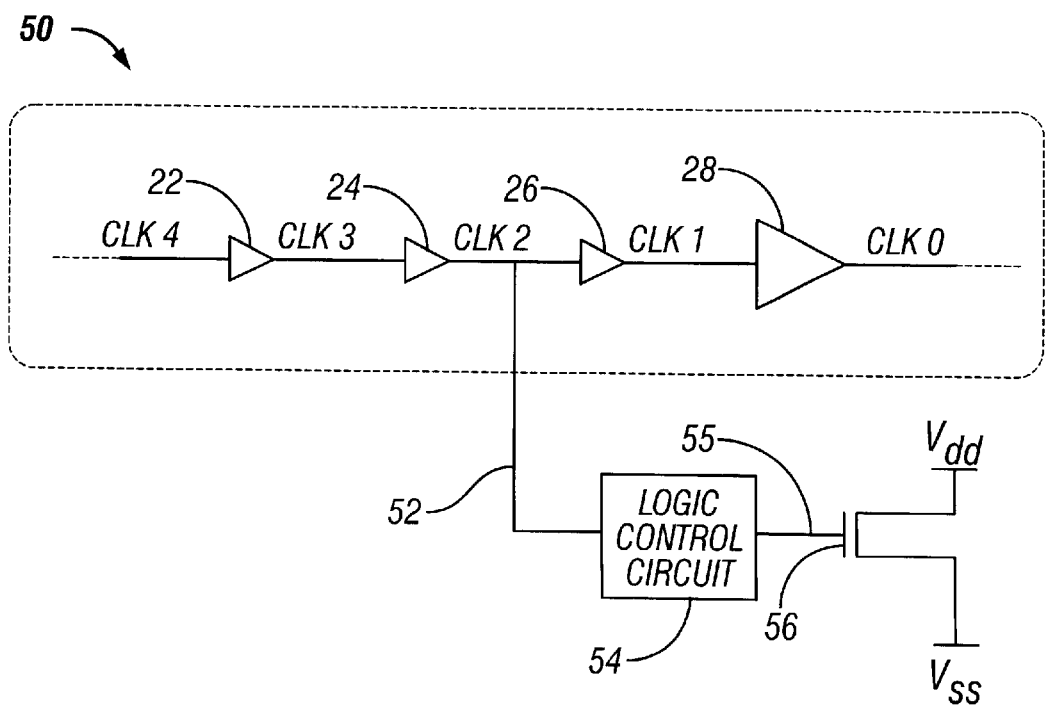
FIG. 5 shows a diagram of a clock distribution tree with a power burning circuit in accordance with one embodiment of the present invention.

In one embodiment, the additional burning of power is accomplished by simply short circuiting the power supply (Vdd) with the system ground (Vss). FIG. 5 shows a diagram of a clock distribution tree with a power burning circuit 50 in accordance with one embodiment of the present invention. As previously shown in FIG. 2, the initial clock signal (CLK4) is input into a series of load buffers 22, 24, and 26. Finally, the clock signal (CLK1) is input into a large load buffer 28 which outputs the final clock signal (CLK0). Each of these buffers 22, 24, 26, and 28 represents certain system components that place a load on the clock signal. The last buffer 28 represents the largest load of the system. Each buffer 22, 24, 26, and 28 places a slight delay on the transmission of the clock to the next buffer. Consequently, the signal for each segment of the clock tree 50 CLK4, CLK3, CLK2, CLK1, and CLK0 lags slightly behind the signal of the immediately preceding segment.

In this embodiment of a clock tree 50, the greatest current demand will come from the large load buffer 28. Consequently, it will be the focus of noise reduction efforts in this tree 50. In order to initiate the power burn, CLK2 is input 52 into a logic control circuit 54. CLK2 is the clock signal immediately preceding CLK1, which is the clock signal of the large load buffer 28. As such, CLK2 arrives at the logic control circuit 54 before CLK1 arrives at the large load buffer 28.

When the logic control circuit 54 senses a transition (either LOW to HIGH or HIGH to LOW) in the CLK2 signal, it will generate a control signal 55 that is HIGH to the control transistor 56. The control transistor 56 is an "N-type" transistor which means that the transistor is "on" (allows current to pass) when the control signal 55 is HIGH. Conversely, the transistor 58 is "off" (does not allow current to pass) when the control signal 55 is LOW. The HIGH control signal 55 will turn the control transistor 56 on which will create the short circuit between Vdd and Vss. This will begin the warm-up transition phase and effectively lengthen the Δt of the clock transition. Once the transition of CLK2 has finished, the logic control circuit 54 will generate a control signal 55 that is LOW to the control transistor 56. The LOW control signal 55 will turn the control transistor 56 off which will end the short circuit between Vdd and Vss. This will end the warm-up transition phase.

While shorting Vdd and Vss has been described as a method of burning power during a warm-up transition phase, it is important to note that alternative embodiments could use other methods of consuming power known that are known in the art. Additionally, it is important to note that the number, the arrangement, and the order of the load buffers 22, 24, 26, and 28 may vary from circuit to circuit, especially with respect to the location and the characteristics of the large load buffer 28. In such cases, the input 52 to the logic control circuit 54 may be taken from among the different clock signals CLK4, CLK3, CLK2, CLK1, and CLK0. This is necessary in order to provide an input 52 to the logic control circuit 54 that is an earlier signal with respect to the signal of the large load buffer 28.

In alternative embodiments, the control transistor 56 may be a P-type transistor or other suitable type switch known in the art. In such a case, the logic control circuit 54 would be reconfigured to activate the alternative type transistor or switch upon the sensing of the transition change of the input signal 52. Conversely, the control circuit 54 would be configured to shut off the alternative type transistor or switch after completion of the transition.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for increasing a transition time period for an edge transition of a clock signal, comprising:

detecting an edge transition of a clock signal; and initiating additional system power consumption upon detecting the edge transition, wherein initiating the additional system power consumption comprises providing a connecting path between a system voltage supply and a system ground, wherein the connecting path comprises at most one transistor.

2. The method of claim 1, wherein the edge transition is detected by a logic control circuit.

3. The method of claim 1, wherein the edge transition of the clock signal is a rising edge transition.

4. The method of claim 1, wherein the edge transition of the clock signal is a falling edge transition.

5. The method of claim 1, wherein the edge transition of a clock signal is detected before the clock signal is input to a system load.

6. The method of claim 1, wherein the at most one transistor is an N-type transistor.

7. The method of claim 1, wherein the at most one transistor is a P-type transistor.

8. An apparatus for increasing a transition time period for an edge transition of a clock signal, comprising:

a control circuit that detects an edge transition of a clock signal; and a power consumption circuit that uses system power upon detection of the edge transition by the control circuit, the power consumption circuit comprising a connecting path between a system voltage supply and a system ground, wherein the connecting path comprises at most one transistor.

9. The apparatus of claim 8, wherein the edge transition of the clock signal is a rising edge transition.

10. The apparatus of claim 8, wherein the edge transition of the clock signal is a falling edge transition.

11. The apparatus of claim 8, wherein the at most one transistor comprises an N-type transistor.

12. The apparatus of claim 8, wherein the at most one transistor comprises a P-type transistor.

13. An apparatus for increasing a transition time period for an edge transition of a clock signal, comprising:

means for detecting an edge transition of a clock signal; and means for using system power upon detection of the edge transition, wherein the means for using comprises a connecting path between a system voltage supply and a system ground using at most one transistor.

* * * * *